US011011495B2

(12) United States Patent
Bhagavat et al.

(10) Patent No.: US 11,011,495 B2
(45) Date of Patent: May 18, 2021

(54) MULTIPLE-DIE INTEGRATED CIRCUIT WITH INTEGRATED VOLTAGE REGULATOR

(71) Applicant: Advanced Micro Devices, Inc., Santa Clara, CA (US)

(72) Inventors: Milind Bhagavat, Los Altos, CA (US); David Hugh McIntyre, Sunnyvale, CA (US); Rahul Agarwal, Livermore, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 68 days.

(21) Appl. No.: 16/110,678

(22) Filed: Aug. 23, 2018

(65) Prior Publication Data

US 2020/0066677 A1 Feb. 27, 2020

(51) Int. Cl.
*H01L 21/00* (2006.01)
*H01L 25/065* (2006.01)
*H01L 25/00* (2006.01)
*H01L 23/00* (2006.01)
*H02M 3/158* (2006.01)
*H02M 3/07* (2006.01)

(52) U.S. Cl.
CPC ......... *H01L 25/0652* (2013.01); *H01L 24/16* (2013.01); *H01L 25/50* (2013.01); *H01L 2224/16145* (2013.01); *H01L 2225/06513* (2013.01); *H01L 2225/06541* (2013.01); *H01L 2225/06548* (2013.01); *H01L 2225/06558* (2013.01); *H01L 2225/06586* (2013.01); *H01L 2924/1427* (2013.01); *H01L 2924/1431* (2013.01); *H02M 3/07* (2013.01); *H02M 3/158* (2013.01)

(58) Field of Classification Search
CPC ............ H01L 23/3128; H01L 23/3675; H01L 23/481; H01L 23/50; H01L 23/5389; H01L 24/00; H01L 24/02; H01L 24/16; H01L 24/18; H01L 24/19; H01L 24/20; H01L 24/81; H01L 24/83; H01L 24/92; H01L 24/97; H01L 24/98; H01L 25/00; H01L 24/03; H01L 25/0652; H01L 25/16; H01L 25/50
USPC .................................. 438/108, 109; 257/686
See application file for complete search history.

(56) References Cited

U.S. PATENT DOCUMENTS 8,563,403 B1 * 10/2013 Farooq .............. H01L 21/76898
438/459
2015/0177823 A1 * 6/2015 Maiyuran .............. G06F 1/3243
713/320

(Continued)

OTHER PUBLICATIONS

Song et al. Coupling Capacitance in Face-to-Face (F2F) Bonded 3D ICs: Trends and Implications, IEEE, pp. 529-536 (Year: 2015).*

(Continued)

*Primary Examiner* — Brook Kebede
(74) *Attorney, Agent, or Firm* — Polansky & Associates, P.L.L.C.; Paul J. Polansky; Rosalynn M. Smith

(57) ABSTRACT

A data processor is implemented as an integrated circuit. The data processor includes a processor die. The processor die is connected to an integrated voltage regulator die using die-to-die bonding. The integrated voltage regulator die provides a regulated voltage to the processor die, and the processor die operates in response to the regulated voltage.

17 Claims, 9 Drawing Sheets

(56) References Cited

U.S. PATENT DOCUMENTS

| | | | | |
|---|---|---|---|---|
| 2015/0356226 A1* | 12/2015 | Yang | .................. | G06F 1/26 |
| | | | | 716/120 |
| 2016/0093588 A1* | 3/2016 | Wang | .................. | H01L 24/00 |
| | | | | 257/737 |
| 2016/0133614 A1* | 5/2016 | Gu | .................. | H01L 25/16 |
| | | | | 257/773 |
| 2018/0082978 A1* | 3/2018 | Yu | .................. | H01L 24/19 |
| 2018/0088614 A1* | 3/2018 | Choi | .................. | H03K 17/165 |

OTHER PUBLICATIONS

Tanim Humayun, Juliana Gjanci, Masud H. Chowdhury; "On-Chip Voltage Regulator without Physical Inductor"; 10th IEEE International NEWCAS Conference; Jun. 17-20, 2012; Montreal, Quebec; Canada; 4 pages.

* cited by examiner

US 11,011,495 B2

MULTIPLE-DIE INTEGRATED CIRCUIT WITH INTEGRATED VOLTAGE REGULATOR

BACKGROUND

Power consumption is a significant design concern in microprocessor-based system design. Designers are continually developing higher performance microprocessors that require correspondingly higher amounts of power to operate. For example, contemporary microprocessors can consume 400 watts (W) and above. At the same time, designers typically use efficient, low-voltage complementary metal-oxide-semiconductor (CMOS) transistor processes. The low voltage used with these CMOS processes increases current for a given level of power consumption, and creates large ohmic (IR) losses in the power supply conductors.

To overcome these IR losses, designers have added more integrated circuit power supply pins to reduce effective resistance and/or provide additional voltage regulators connected in parallel on a printed circuit board nearby and or adjacent to a package having the microprocessor. The additional device pins and/or components, however, increase system cost.

Figure 1:
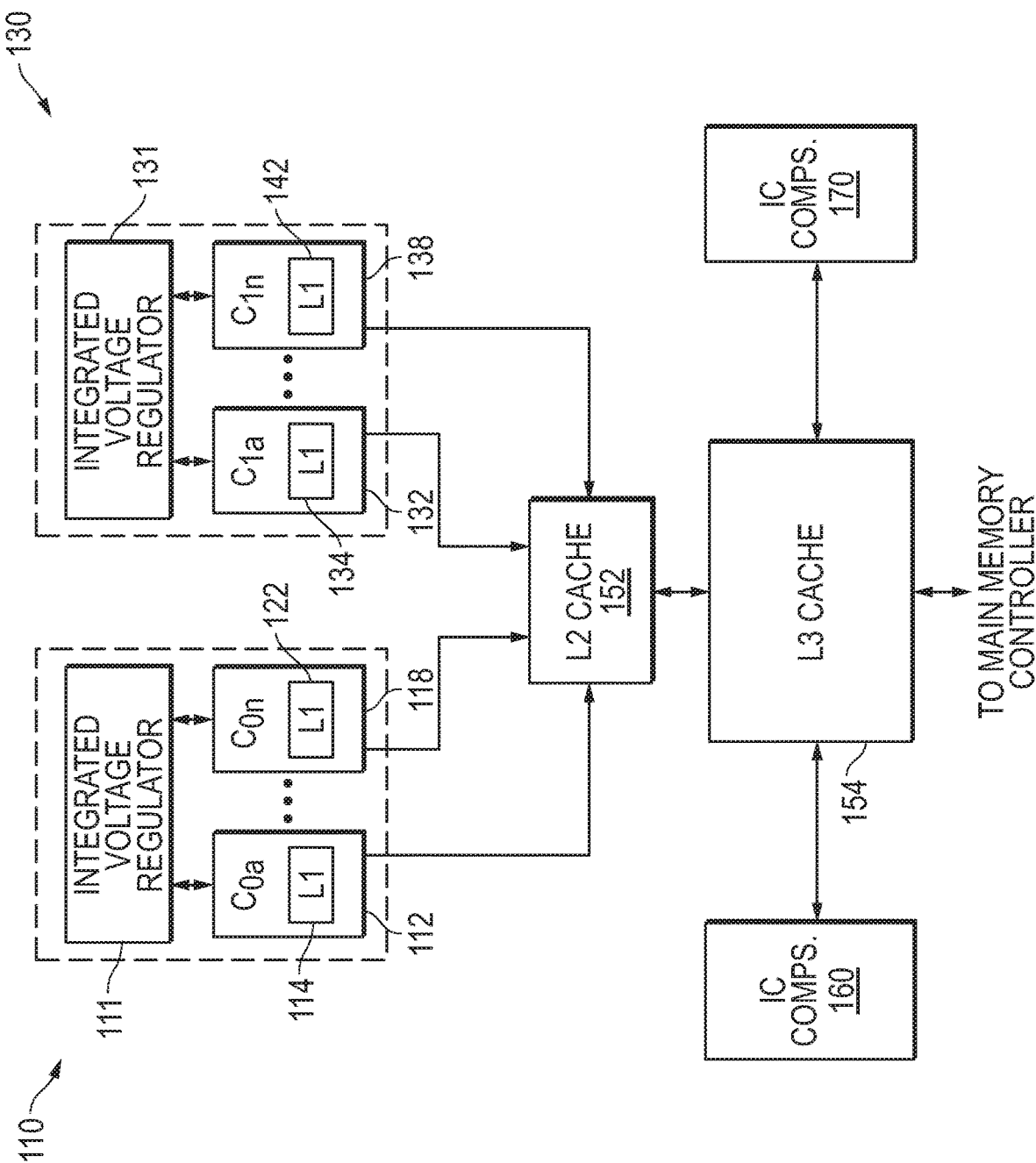
FIG. 1 illustrates in block diagram form a data processing system having multiple-die integrated circuits with integrated voltage regulators (IVR) dies according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a data processing system includes a data processor implemented as an integrated circuit. An integrated voltage regulator die is coupled to the processor die using die-to-die bonding. The integrated voltage regulator die provides a regulated voltage to the processor die. Further, the processor die operates in response to the regulated voltage.

In another form, an integrated circuit die includes a processor die and an integrated voltage regulator die. The integrated voltage regulator die is coupled to the processor die. The processor die and the integrated voltage regulator die are combined in a single integrated circuit package using hybrid bonding.

In still another form there is described a method for fabricating a processor die. Fabricating the processor die includes forming a plurality of hybrid bond landing pads on a surface of the processor die. Further, fabricating the processor die includes coupling the hybrid bond landing pads of the processor die to a corresponding plurality of hybrid bond landing pads on a surface of an integrated voltage regulator die, to form a stacked integrated circuit.

FIG. 1 illustrates in block diagram form a data processing system 100 having multiple-die integrated circuits with integrated voltage regulator (IVR) die according to some embodiments. Data processing system 100 includes generally a data processor 110 and 130, a shared level-two (L2) cache 152, a shared level-three (L3) cache, and additional IC components 160 and 170. In the example shown in FIG. 1, data processor 110 is a single-chip multi-core processor that includes a first group of first central processing unit (CPU) cores represented as CPU cores 112-118, and labeled as $C_{0a}$-$C_{0n}$ and a second group of CPU cores represented as CPU cores 132-138, and labeled as $C_{1a}$-$C_{1n}$. CPU cores 112-118 and 132-138 respectively include L1 caches 114, 122, 134, and 142. The first group of CPU cores 112-118 are connected to a first integrated voltage regulator (IVR) 111. The second set of CPU cores 132-138 are connected to a second IVR 131. A L2 cache 152 is bi-directionally connected to each of CPU cores 112, 118, 132, and 138. Data processor 110 also includes an L3 cache 154 that is configured to bi-directionally connect to a memory controller as well as other integrated circuit (IC) components as represented by IC components 160 and 170. IC components can include, for example, graphic processing units, a system management unit, and display engines. Data processor 110 could be replaced with other types of data processors including accelerated processing units (APUs), digital signal processors (DSPs), single-core processors, graphics processing units (GPUs), neural network processors, etc.

CPU cores 112-118 and 132-138 have a bidirectional port connected to a first bidirectional port of shared L2 cache 152 over a bidirectional bus. CPU core 116 has a bidirectional port connected to a second bidirectional port of shared L2 cache 152 over a bidirectional bus. Shared L2 cache 152 has a third bidirectional port connected to a first bidirectional port of L3 cache 154. and IC components 160 and 170 over a bidirectional bus.

The first and second IVRs 111 and 131 are combined with data processor 110 in a single integrated circuit package using die-to-die bonding technology. IVRs 111 and 131 provide respective regulated voltages to the first group of CPU cores 112-118 and the second group of CPU cores 132-138. In the example illustrated in FIG. 1, it includes two separate IVRs, however, one or more IVRs can be advantageously implemented using die to die bonding technology to form a stacked integrated circuit that provides a regulated voltage to data processor 110, as will now be described.

Figure 2:
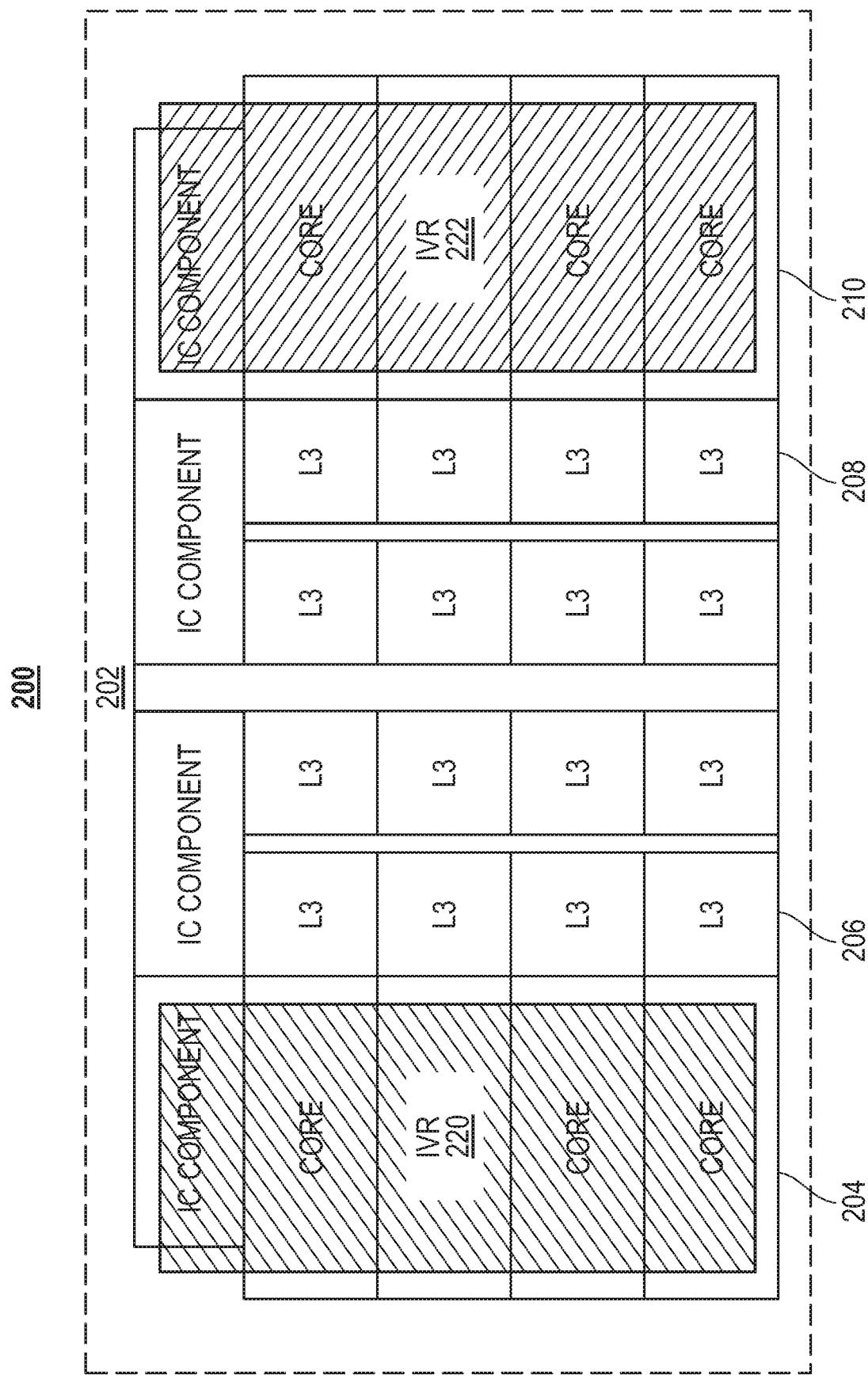
FIG. 2 illustrates a plan view of an integrated circuit having a processor die with overlying IVR dies suitable for use in data processing system 100 of FIG. 1 according to some embodiments.

FIG. 2 illustrates a plan view of an integrated circuit 200 having a processor die 202 with overlying IVR dies 220 and 222 suitable for use in data processing system 100 of FIG. 1 according to some embodiments. As shown in FIG. 2, processor die 202 includes a set of eight data processor cores including a set of four data processor cores 204 along a left side and a set of four data processor cores 210 along a right side as integrated circuit 200 is oriented in FIG. 2. Processor die 202 also includes the L3 cache divided into portions including a left set of circuit tiles 206 and a right set of circuit tiles 208 between data processor cores 204 and 210. Along a top portion of processor die 202 is a set of various other components that correspond to the other circuits shown in FIG. 1. Separating left and right portions of processor die 202 is an unlabeled area with other circuits such as buses, drivers, and other smaller circuit blocks. IVR die 220 overlies and is connected to data processor cores 204, whereas IVR die 222 overlies and is connected to data processor cores 210. Integrated circuit 200 appears to the user as an integrated whole although it is formed with separate semiconductor die.

IVR dies 220 and 222 provide variable power supply voltages to respective data processor cores. When using digital voltage and frequency scaling (DVFS), each data processor core may operate at a different voltage and frequency pair. Each of IVR dies 220 and 222 include multiple IVRs. Each of the multiple IVRs provide respective regulated voltages to separate cores of data processor cores 204 and 210 within processor die 202 according to the voltage settings.

In a single integrated circuit package IVR dies 220 and 222 are combined with processor die 202 and connected to it in close proximity using hybrid bonding. Using hybrid bonding techniques to connect processor die 202 to IVR dies 220 and 222 can provide approximately 100,000 connections between the dies per square millimeter. Once the voltage applied to the integrated circuit package has been down converted, the hybrid bond connections allow current to pass to processor die 202 with less loss than when current passes through bumps and/or solder. Moreover, as will be described further below, integrated circuit 200 leverages modern integrated circuit fabrication techniques to integrate reactive elements, i.e. capacitors and/or inductors, used for direct current to direct current (DC-DC) conversion in switched mode power supplies.

Figure 3:
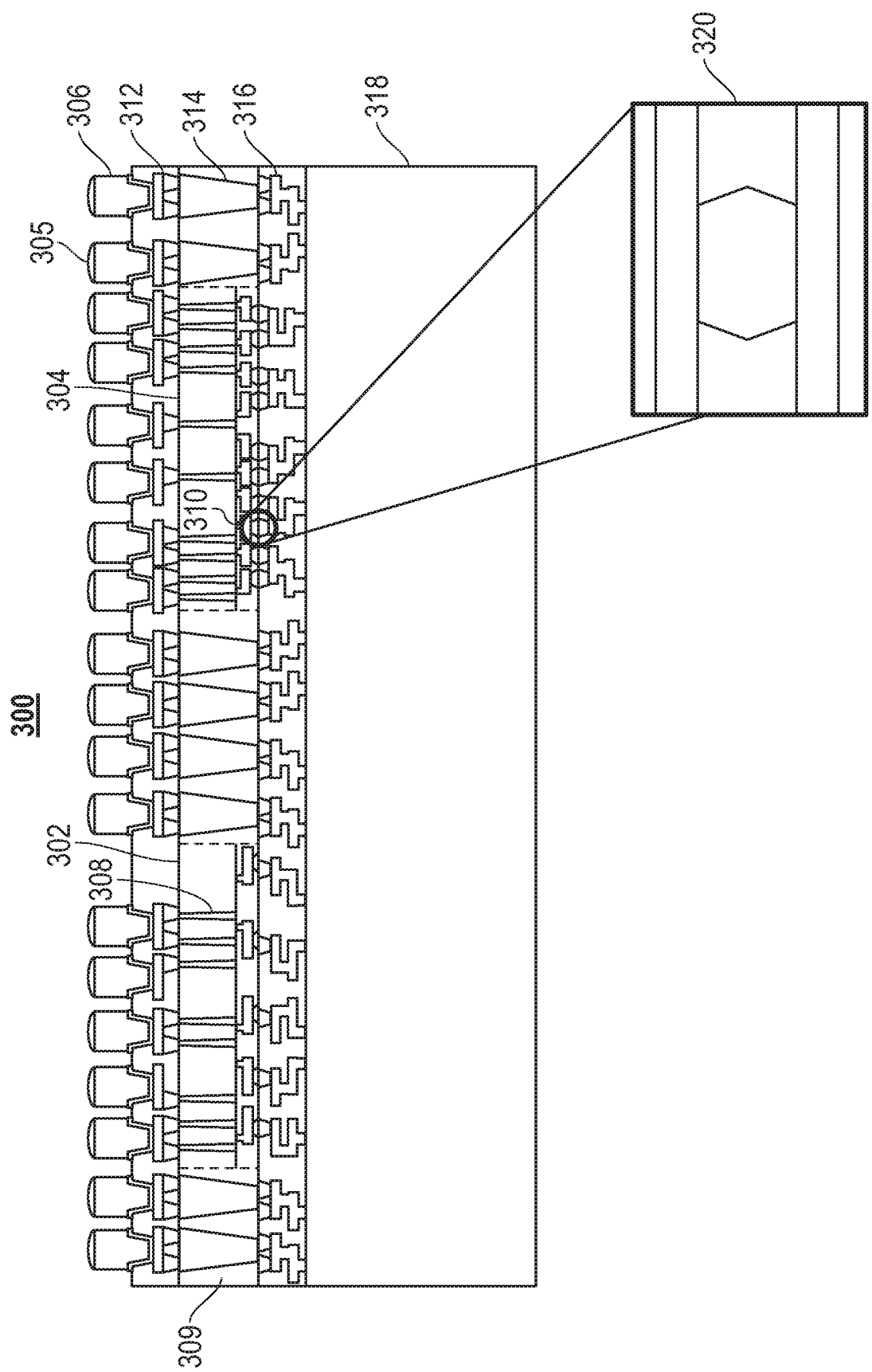
FIG. 3 illustrates a cross-sectional view of a multiple-die integrated circuit having multiple IVR dies for use in the data processing system of FIG. 1 according to some embodiments.

FIG. 3 illustrates a cross-sectional view of a multiple-die integrated circuit 300 having multiple IVR dies 302 and 304 for use in the data processing system 100 of FIG. 1 according to some embodiments. Multiple-die integrated circuit 300 includes generally IVR dies 302 and 304, and processor die 318.

IVR dies 302 and 304 of multiple-die integrated circuit 300 each include a group of through-silicon vias (TSVs) 308 and a group of hybrid bonds 310 which connect to processor die 318. Additionally, the layers of multiple-die integrated circuit 300 include a group of bumps 305, copper pillars 306, gap fill dielectric 309, post-bond back end of line (BEOL) layer 312, a group of through-dielectric vias (TDVs) 314, metallization layer 316, and the silicon region on which the integrated circuit is fabricated, referred to herein as processor die 318. TSVs 308 form vertical connections throughout IVR dies 302 and 304 passing signals from IVR dies 302 and 304 through to respective portions of processor die 318. A metallization layer, such as multi-layer metallization 316 forms connections between circuits within multiple-die integrated circuit 300. A first layer of hybrid bonds 310 are deposited on the surface of multi-layer metallization 316. TSVs 308 of IVR die 302 connect to hybrid bonds on the surface of multi-layer metallization 316. Similarly, TSVs 308 of IVR 304 connect to hybrid bonds on the surface of multi-layer metallization 316. A first surface, also described as the face, of IVR die 302 is connected to the face of processor die 318 over a first portion of processor die 318. Similarly, a first surface, also described as the face, of IVR 304 is connected to the face of processor die 318 over a second portion of processor die 318. The group of TSVs at a back surface of IVR dies 302 and 304 connect to post-bond BEOL layer 312 that is formed above IVR dies 302 and 304. IVR dies 302, 304, and TDVs 314 are surrounded by gap fill dielectric 309. TDVs 314 extend from processor die 318 through to a group of copper pillars 306 and corresponding bumps 305, which form the active surface of multiple-die integrated circuit 300.

In operation, IVR die 302 and 304 include multiple IVRs that provide DC-DC voltage regulation to processor die 318. IVR dies 302 and 304 are connected to processor die 318 via die-to-die bonding to form multiple-die integrated circuit 300. The multiple-die integrated circuit 300 is packaged in a single integrated circuit. The group of hybrid bonds 310 are utilized to connect the face of IVR die 302 to a specified portion processor die 318 for providing respective regulated voltages to separate cores in a corresponding portion of processor die 318. Further the face of IVR die 304 is connected, using the group of hybrid bonds 310, to a specified portion of processor die 318 for providing respective regulated voltages to corresponding portions of processor die 318. The active surface of IVR die 302 and the active surface of IVR 304 face the active surface of processor die 318. TSVs 308 extend through IVR dies 302 and 304 to the face of processor die 318 to selectively transport data and other signals to respective portions of processor die 318. IVR dies 302 and 304 dynamically determine respective regulated voltages based on respective operating frequencies of the separate portions of processor die 318. In another embodiment, IVR dies 302 and 304 are fabricated without TSVs. Terminals of power converter circuits within IVR dies 302 and 304 are connected to power supply terminals of processor die 318 via the group of hybrid bonds 310. Therefore, power is supplied to processor die 318 without the use of TSVs.

IVR dies 302 and 304 to the face of data processor 318 using hybrid bond technology reduces IR losses when IVR dies 302 and 304 provide low-voltage, high current. Further, with the integration of IVR die 302 and 304 on chip, the integrated circuit package can sustain requirements for substantially large currents. For example, with the introduction of 400 to 700 watts power to the integrated circuit package, having 0.7-volt operation needed for approximately seven nanometer features, the amount of current draw could be on the order of 700 to 1000 amps. Connecting IVR dies 302 and 304 to processor die 318 as a multiple die integrated circuit using hybrid bonding enables efficient current draw without loss incurred by electromigration limitations as experienced with higher voltage external regulators. The interfaces between processor die 318 and respective IVR die 302 and 304 are face-to-face, enabling IVR dies 302 and 304 to respectively drive current into processor die 318 without significant loss. Positioning IVR die 302 and 304 as close to the surface of processor die 318 as possible minimizes voltage (IR) loss improving power delivery and enabling higher operating frequencies for data processing system 100 of FIG. 1, and faster response to the changes in load activity.

Figure 4:
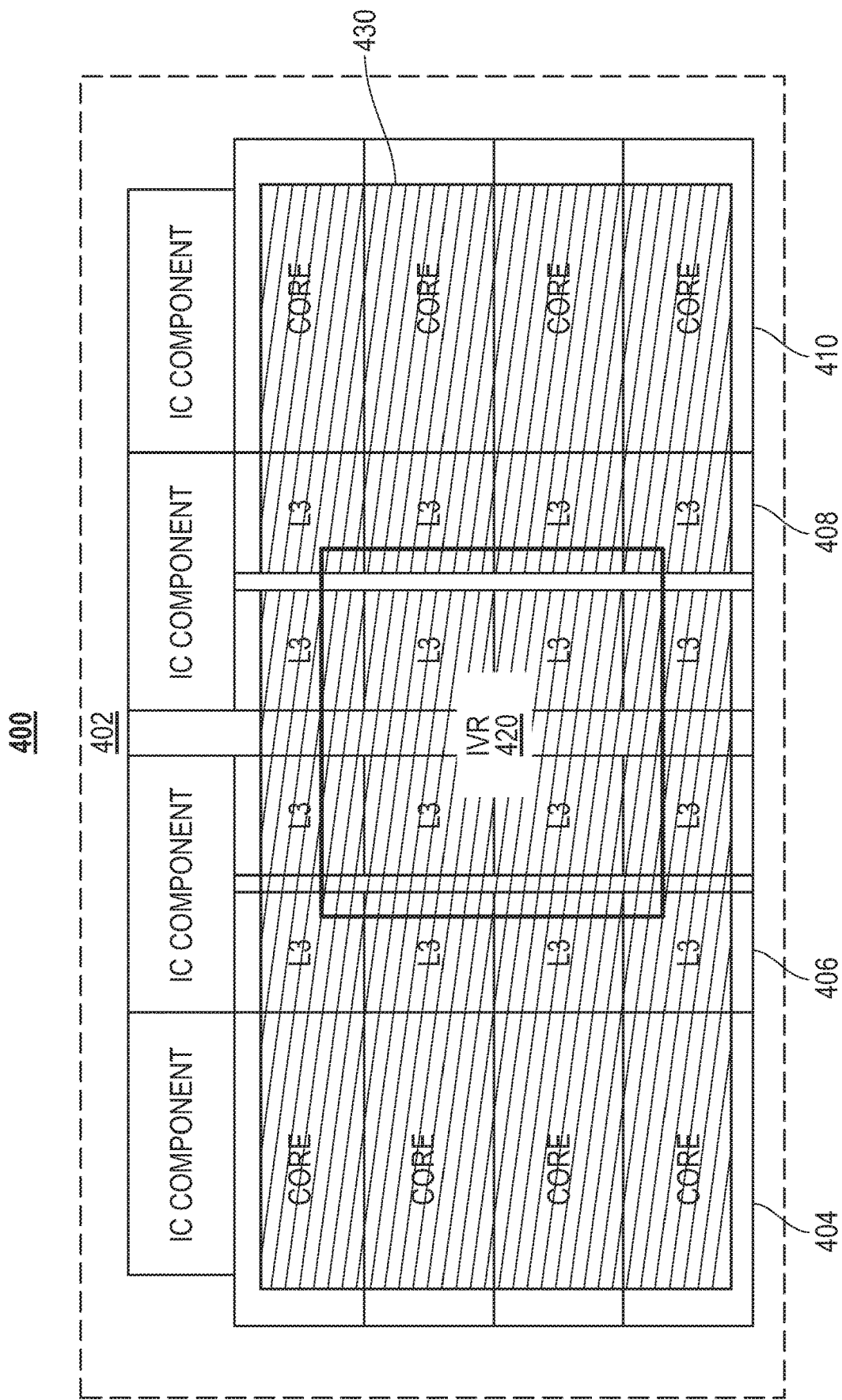
FIG. 4 illustrates a plan view of a multiple-die integrated circuit having a processor die with an overlying IVR die suitable for use in the data processing system of FIG. 1 according to some embodiments.

FIG. 4 illustrates a plan view of a multiple-die integrated circuit 400 having a processor die 402 with an overlying IVR die 420 suitable for use in data processing system 100 of FIG. 1 according to some embodiments. As shown in FIG. 4, processor die 402 includes a set of eight data processor cores including a set of four data processor cores 404 along a left side and a set of four data processor cores 410 along a right side as processor die 402 is oriented in FIG. 4. Processor die 402 also includes the L3 cache divided into portions including a left set of circuit tiles 406 and a right set of circuit tiles 408 between data processor cores 404 and 410. Along a top portion of processor die 402 is a set of various other integrated circuit components that correspond to the other circuits shown in FIG. 1. Separating left and right portions of processor die 402 is an unlabeled area with other circuits such as buses, drivers, and smaller circuit blocks. IVR die 420 overlies and is connected to processor die 402, and redistribution layer 430 is formed between the active surface of IVR die 420 and the active surface of processor die 402. Integrated circuit 400 appears to the user as an integrated whole circuit although it is formed with separate semiconductor die.

IVR die 420 provides variable power supply voltages to respective data processor cores. When using DVFS, each portion of processor die 402 and/or each data processor core, thereof, may operate at a different voltage and/or frequency. Therefore, IVR die 420 dynamically determines respective regulated voltages based on respective operating frequencies of the separate portions of the processor die, for example, data processor cores 404 and 410. Input/output connects are formed throughout RDL layer 430 to communicate signals and low impedance power between processor die 402 and IVR die 420. IVR die 420 and processor die 402 are connected back-to-face using hybrid bonding. RDL layer 430 is connected to a face surface of IVR die 420 and to processor die 402 using TSVs.

IVR die 420 is combined with processor die 402 and connected to it in close proximity using die-to-die bonding to provide lower impedance power supplies. Similar to integrated circuit 200, integrated circuit 400 provides a low-cost implementation of a data processing system by more closely integrating components, reducing system cost by reducing the number of discrete components required. Further, as will be described below, integrated circuit 200 leverages modern integrated circuit fabrication techniques to integrate reactive elements, i.e. capacitors and/or inductors, used for DC-DC conversion in switched mode power supplies.

Figure 5:
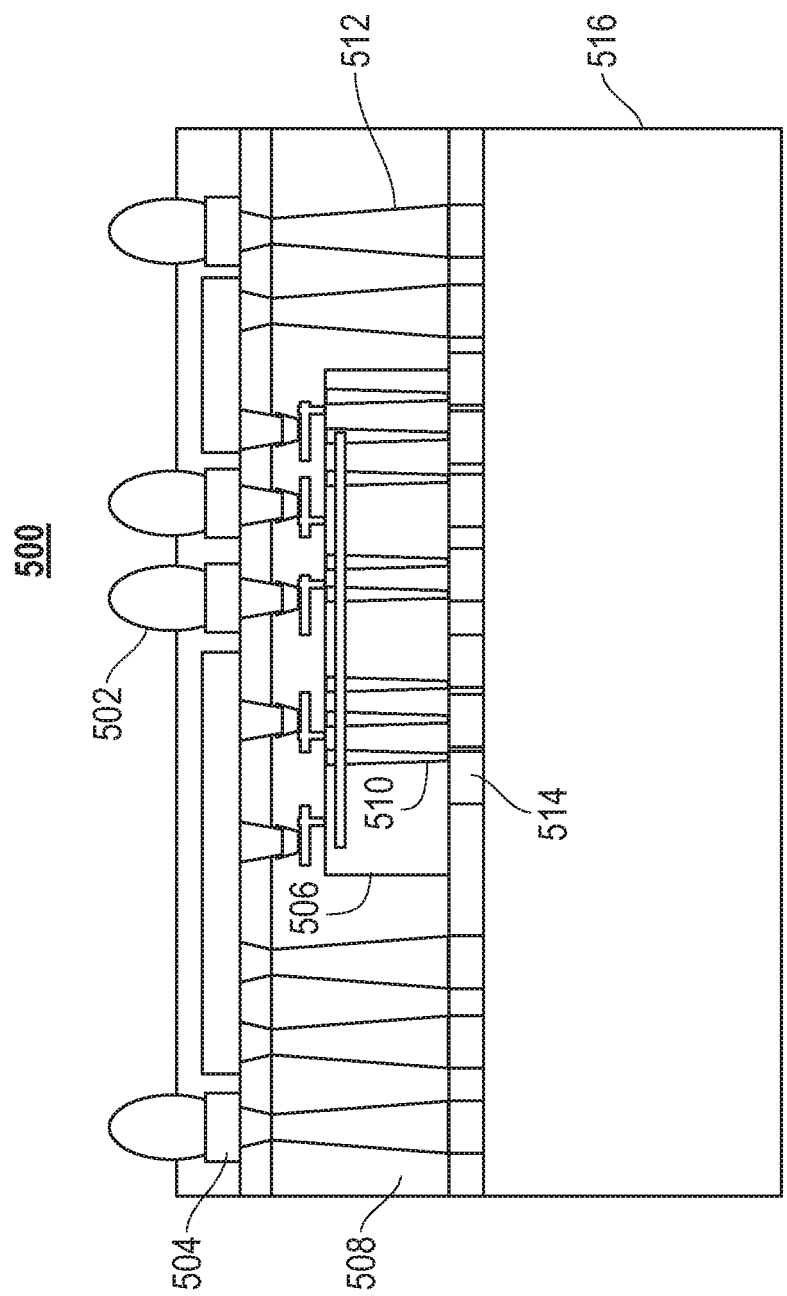
FIG. 5 illustrates a cross-sectional view of a multiple-die integrated circuit having an IVR die for use in the data processing system of FIG. 1 according to some embodiments.

FIG. 5 illustrates a cross-sectional view of multiple-die integrated circuit 500 having an IVR die 506 for use in the data processing system 100 of FIG. 1 according to some embodiments. Multiple-die integrated circuit 500 includes generally IVR die 506 and processor die 516.

IVR die 506 includes a plurality of TSVs 510 that connect IVR die 506 to processor die 516 via a group of hybrid bonds. The group of TSVs 510 form vertical connections throughout IVR die 506 passing signals and power from IVR die 506 through respective portions of processor die 516. Redistribution layer 504 connects the face of IVR die 506 to the surface of multiple-die integrated circuit 500. The back surface of IVR die 506 connects to processor die 516 via die-to-die bonding using hybrid bonds 514. A group of TDVs 512 connect processor die 516 to the surface of multiple-die integrated circuit 500. A group of copper pillars 502 extend from the redistribution layer and form the active surface of multiple-die integrated circuit 500. Copper pillars 502 communicate signals from processor die 516 to subsequent die and/or subsequent integrated circuit components. The multiple-die integrated circuit 500 is packaged in a single integrated circuit.

In operation, IVR die 506 provides DC-DC voltage regulation to processor die 516. IVR die 506 can be implemented as a switch mode power supply or a switch capacitor converter which is connected to processor die 516 at a location that is central to multiple processor cores using hybrid bonding. The group of hybrid bonds 514 are utilized to connect the back of IVR die 506 to the face surface of processor die 516 for providing respective regulated voltages to a corresponding portion of processor die 516. IVR die 506 dynamically determines respective regulated voltages based on respective operating frequencies of the separate portions of processor die 516. The regulated voltage is passed to different regions of the processor through redistribution layer 504.

Figure 6:
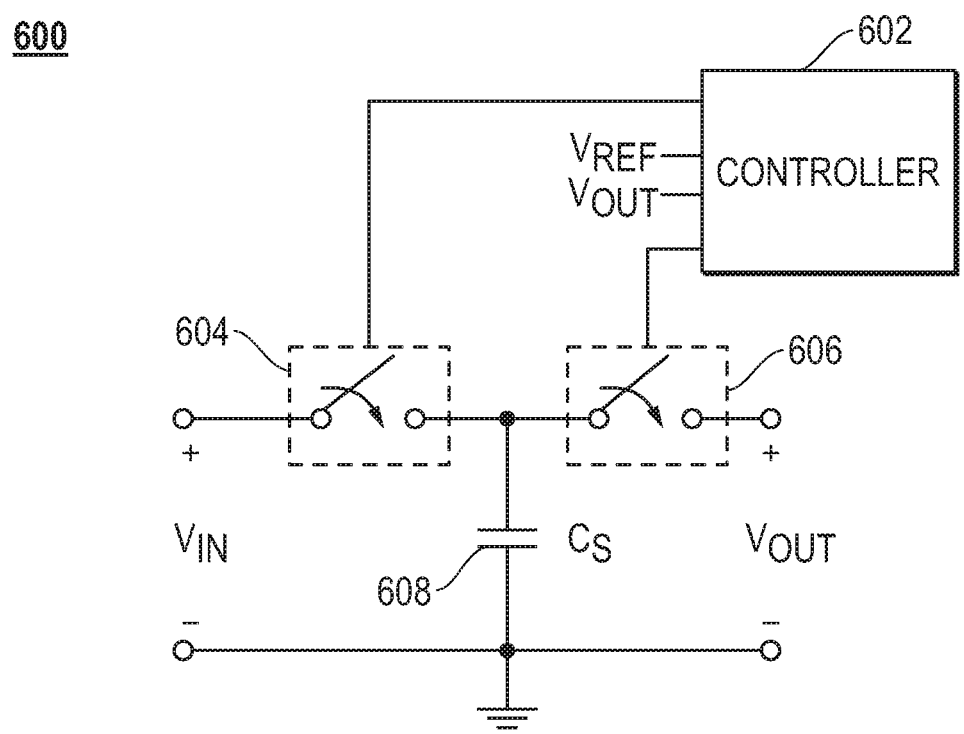
FIG. 6 illustrates in partial block diagram form and partial schematic form an exemplary switched capacitor converter circuit for use as a voltage regulator in the data processing system of FIG. 1 according to some embodiments.

FIG. 6 illustrates in partial block diagram form and partial schematic form an exemplary switched capacitor converter circuit 600 for use as a voltage regulator in data processing system 100 of FIG. 1 according to some embodiments. Switched capacitor converter circuit 600 includes generally a controller 602, a first switch 604, a second switch 606, and a capacitor 608.

First switch 604 has an input terminal connected to the positive terminal of an input voltage ($V_{IN}$) source, and a second terminal connected to the first terminal of capacitor 608. The first terminal of capacitor 608 also connects to a first terminal of second switch 606, and capacitor 608 has a second terminal connected to ground. The second terminal of second switch 606 connects to an output voltage ($V_{OUT}$) terminal which connects to the second terminal of capacitor 608. Controller 602 controls first switch 604 and second switch 606 to alternatively connect the first terminal of capacitor 608 to the input voltage source or the output voltage terminal according to a duty cycle that is dynamically determined based on a reference voltage input.

In operation, an input voltage is received at the input node. A respective portion of a processor is connected to switch capacitor converter circuit 600 as the load. Controller 602 has an input for receiving a reference voltage ($V_{REF}$) and an input for receiving output voltage, $V_{OUT}$. Controller 602 monitors $V_{OUT}$ and compares $V_{OUT}$ to $V_{REF}$. Controller 602 regulates the duty cycle of first switch 604 and second switch 606 to make $V_{OUT}$ (or a fraction of $V_{OUT}$) equal to $V_{REF}$. In response to $V_{OUT}$ being too low, controller 602 increases the duty cycle of first switch 604 in comparison to second switch 606 to charge capacitor 608. Capacitor 608 discharges to the load, correcting the $V_{OUT}$.

The feedback control system of switched capacitor converter circuit 600 enables the voltage supplied to respective portions of the processor to receive an adjusted $V_{OUT}$ based on the desired voltage, $V_{REF}$. Switched capacitor converter circuit 600 receives $V_{IN}$ as the input power supply and converts $V_{IN}$ to another voltage based on the desired $V_{REF}$ with high efficiency under most load conditions. Switched capacitor converter circuit 600 provides better conversion efficiency as opposed to linear regulators under most load conditions. IVR die 420, for example, includes multiple switched capacitor converter circuits 600. Therefore, each one of the switched capacitor converter circuits 600 supplies a different regulated output voltage. By using different switchable topologies of a switched capacitor converter, a circuit such as switched capacitor converter circuit 600 provides a wide conversion range from near 0 to near 1 that is useful for DVFS, while operating at high efficiency for most load ranges. More complex configurations of a switched capacitor circuit can be implemented to provide the desired voltage conversion. Modern integrated circuit fabrication technologies also allow the fabrication of high-valued on-chip capacitors using, for example trench capacitors, making it possible to integrate capacitor 608 onto the IVR die along with controller 602 and the other elements of switched capacitor converter circuit 600 in some applications.

Figure 7:
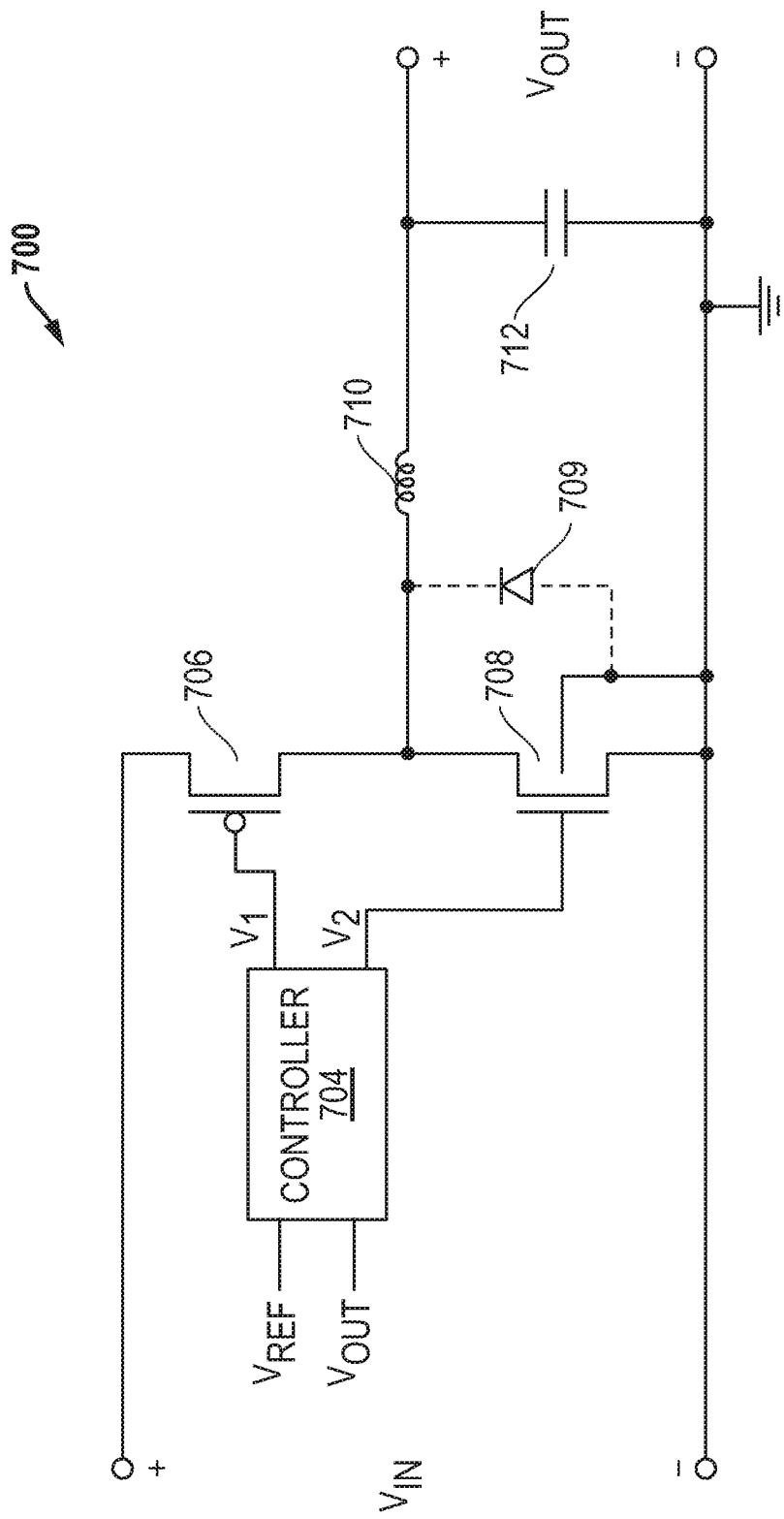
FIG. 7 illustrates in partial block diagram form and partial schematic form an exemplary power converter circuit for use as a voltage regulator in the data processing system of FIG. 1 according to some embodiments.

FIG. 7 illustrates in partial block diagram form and partial schematic form an exemplary power converter circuit 700 for use as a voltage regulator in the data processing system of FIG. 1 according to some embodiments. Power converter circuit 700 includes generally a controller 704, transistors 706 and 708, an optional diode 709, an inductor 710, and a capacitor 712.

Transistor 706 has a source terminal connected to $V_{IN}$, a gate terminal connected to an output terminal of controller 704 (as $V_1$), as well as a drain terminal connected to the drain terminal of transistor 708 and a first terminal of inductor 710. Transistor 708 includes a source terminal that is connected to ground, and a gate terminal that is connected to an output terminal of controller 704 ($V_2$). The second terminal of inductor 710 is connected to a first terminal of capacitor 712, and provides power supply voltage, $V_{OUT}$. Further, the second terminal of capacitor 712 is connected to ground to which $V_{OUT}$ is referenced. Capacitor 712 may either be an explicit capacitor or may represent the load capacitance. In this example transistor 706 is a p-channel field-effect transistor (PFET) and transistor 708 is an n-channel field effect transistor (NFET), but these transistors can be replaced by any device operating as a switch, including NFET/PFET or bipolar devices. In one embodiment, there can also be an optional diode 709 formed between the body and drain of transistor 708.

In operation, power converter circuit 700 is a step-down (buck) voltage converter that stores energy in the magnetic field of inductor 710 and releases the energy to a load to form $V_{OUT}$ at a desired value less than $V_{IN}$. In the first phase of operation, transistor 706 (a field effect transistor in this example) operates as a first switch, controlled by controller 704, that connects the $V_{IN}$ to the first terminal of inductor 710. In response to $V_{IN}$ connecting to inductor 710, increased current flows through the inductor and increases $V_{OUT}$. In a second phase of operation, transistor (switch) 706 is turned off and transistor (switch) 708 is turned on, which causes the first terminal voltage of inductor 710 to drop to GND which causes the current through inductor 710 and voltage $V_{OUT}$ to decrease. Controller 704 compares $V_{REF}$ to $V_{OUT}$ (or a fraction of $V_{OUT}$). Controller 704 dynamically changes the duty cycle for power converter circuit 700 to determine the percentage of the time that transistors 706 and 708 conduct current, based on the ratio of $V_{REF}$ to $V_{OUT}$; thereby, controller 704 regulates $V_{OUT}$ to a desired value. In a preferred embodiment, transistors 706 and 708 are controlled in such a way that they are not turned on at the same time. To the extent that this could leave the first terminal of inductor 710 floating, the optional diode 709 (if present) will prevent the first inductor terminal voltage from dropping below ground by more than a forward biased diode voltage drop.

By using an inductive buck converter architecture, power converter circuit 700 provides a wide conversion range from near 0 to near 1 that is useful for DVFS, while operating at high efficiency for most load ranges. Modern integrated circuit fabrication technologies also allow the fabrication of high-quality and high-density on-chip inductors, making it possible to integrate inductor 710 onto the IVR die along with controller 704 and the other elements of power converter circuit 700 in some applications.

While FIG. 6 and FIG. 7 have shown examples of switched capacitor and buck converter regulators, a practitioner skilled in the art will recognize other variations on these regulator types are possible.

Figure 8:
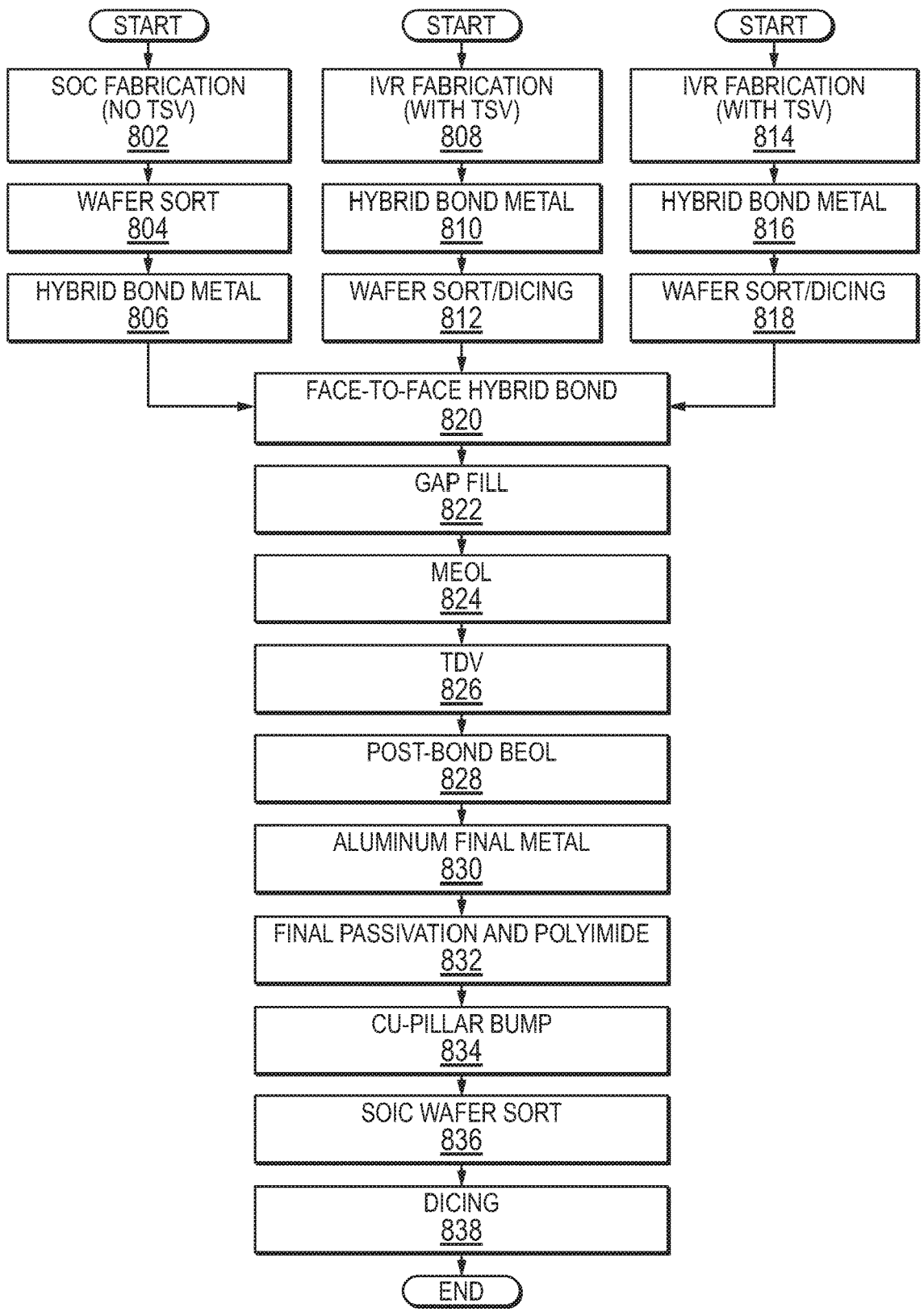
FIG. 8 illustrates a flow diagram of a method for fabricating a multiple-die integrated circuit having multiple IVR die and a multi-core processor die according to some embodiments.

FIG. 8 illustrates a flow diagram of a method 800 for fabricating multiple-die integrated circuit 300 having multiple IVR die and a multi-core processor according to an embodiment. In one embodiment, method 800 includes fabricating a system-on-chip (without TSVs) at block 802. The integrated circuit is formed on a wafer having a number of dies. At block 804 the wafer proceeds to a wafer sorting step where individual integrated circuit die formed within the wafer are tested, or probed, while the silicon die is in wafer form, to identify good and bad die. At block 806, a first face of the wafer receives a deposition of hybrid bonding metal.

The next process flow initiates at the start block and proceeds to block 808. At block 808 the IVR die having TSVs is fabricated. The IVR die receives hybrid bond metal at block 810. At block 812, the method continues to IVR die wafer sorting and dicing. The next portion of the process flow initiates at the start block and continues to fabrication of a subsequent IVR die having TSVs, at block 814. At block 816 the IVR die receives hybrid bond metal. The method continues to wafer sort and dicing at block 818.

At block 820, the method includes bonding the face of the system on chip to the face of each IVR die using die-to-die bonding interconnection points, such as hybrid bonds to form a multiple-die integrated circuit. At block 822 the method includes depositing a gap fill dielectric between the unbonded portions and/or open areas of the multiple-die integrated circuit. The method continues to mid-end-of line (MEOL) processing at block 824. At block 826, TDVs are formed in the multiple-die integrated circuit to connect electrical signals traveling from the processor die to bumps at the active surface of multiple-die integrated circuit. Post-bond back-end-of-line processing is performed at block 828. At block 830, aluminum metal is deposited on the surface of multiple-die integrated circuit for current distribution. Polyimide is deposited and processed as a passivation layer at block 832. At block 834 copper pillar bumps are formed on the surface of the multiple-die integrated. The multiple-die integrated circuit is tested and sorted during the silicon-on-integrated-circuit (SOIC) wafer sort at block 836. At block 838 the wafer that includes the multiple-die integrated circuit is diced to be placed in respective integrated circuit packages.

Figure 9:
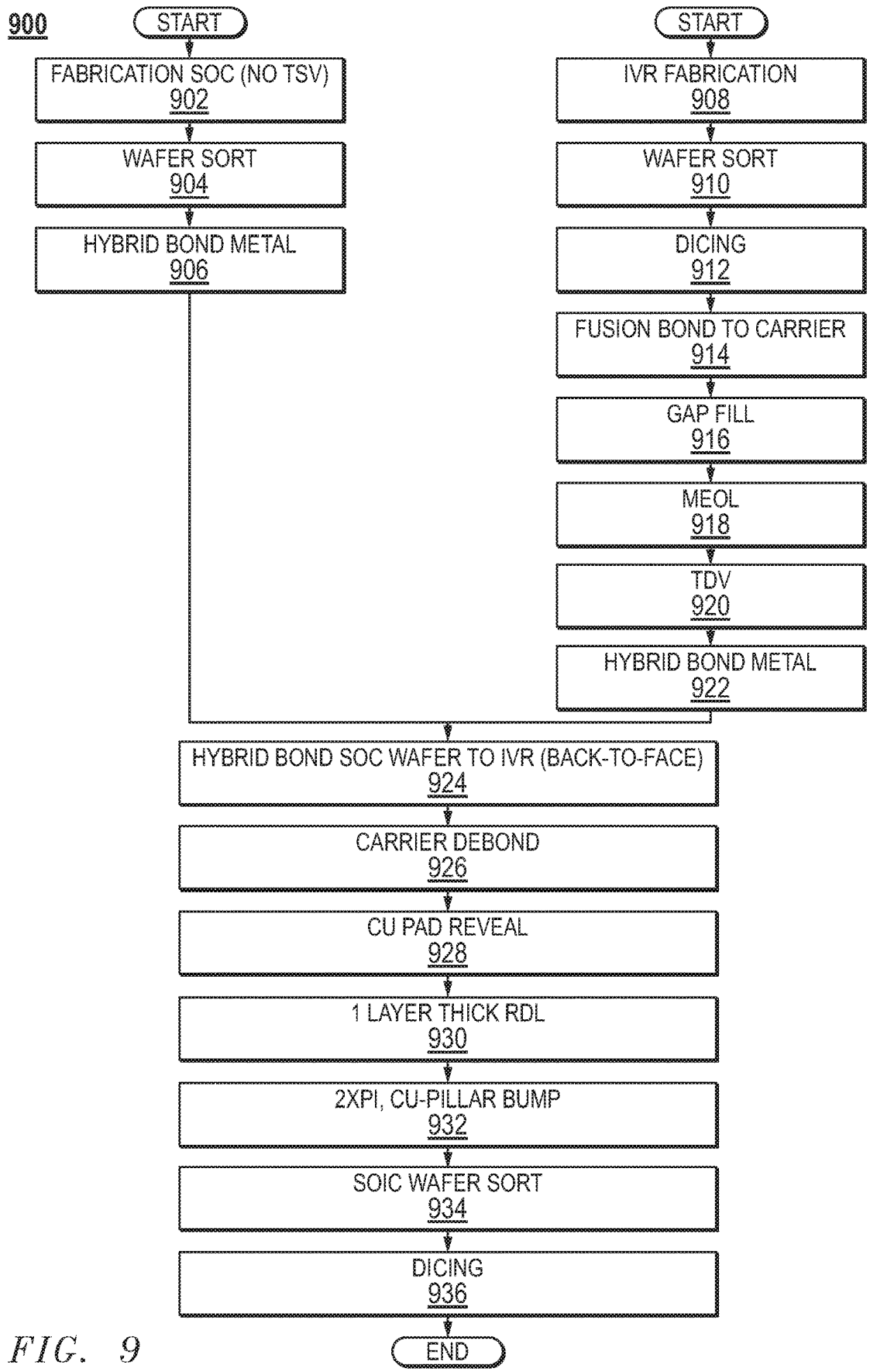
FIG. 9 illustrates a flow diagram of a method for fabricating a multiple-die integrated circuit having an IVR die and a multi-core processor die according to some embodiments.

FIG. 9 illustrates a flow diagram of a method 900 for fabricating multiple-die integrated circuit 400 having an IVR die and a multi-core processor according to some embodiments.

In the illustrated embodiment, method 900 includes fabricating an integrated circuit (without TSVs) as a system on chip at block 902. The integrated circuit is formed on a wafer having a number of integrated circuits. At block 904 the wafer proceeds to a wafer sorting step where individual integrated circuits formed within the wafer are tested, or probed, while the silicon die is in wafer form. At block 906, a first face of the wafer receives a deposition of hybrid bonding metal.

The next process flow initiates at the start block and proceeds to block 908. At block 908 the IVR die having TSVs is fabricated. At block 910, the method continues to IVR die wafer sorting, then dicing at block 912. At block 914, fusion bonding is utilized to bond the IVR die to a carrier in preparation for the RDL. At block 916 the method includes depositing a gap fill dielectric. The method continues to mid-end-of line (MEOL), processing at block 918. At block 920, TDVs are formed in the multiple-die integrated circuit to connect electrical signals traveling from the processor die to bumps at the active surface of multiple-die integrated circuit. At block 922 the IVR die receives hybrid bond metal. The method includes bonding the back of the IVR die to the face of the system on chip using hybrid bonds. The carrier is debonded at block 926. At block 928 the copper pad is revealed. A one layer thick RDL is deposited at block 930. Bumps, such as copper (Cu) pillar bumps are formed at block 932. The multiple-die integrated circuit is tested and sorted during the SOIC wafer sort at block 934. At block 936 the wafer that includes the multiple-die integrated circuit is diced to be placed in respective integrated circuit packages.

In the foregoing examples, a die-to-die die bonding technology, such as hybrid bonding, is utilized for three-dimensional die stacking to distribute signals from one die to another. However, the die-to-die bonding technology utilized to bond an integrated voltage regulator die to a processor die can take on a variety of alternative forms. Other die-to-die bonding technologies can be utilized in place of the hybrid bond technology. Compatible interconnect technologies include bonds with dense pitches and low parasitic overhead, for example, thermal compression bonding and direct oxide bonding.

Some or all of the methods illustrated in FIGS. 8-9 may be governed by instructions that are stored in a computer readable storage medium and that are executed by at least one processor. Each of the operations shown in FIGS. 8-9 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

While particular embodiments have been described, various modifications to these embodiments will be apparent to those skilled in the art. For example, the processor die or IVR dies may be described or represented at least in part by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool that may synthesize the description to produce a netlist comprising a list of gates from a synthesis library. The netlist comprises a set of gates that also represent the functionality of the common integrated circuit die. The netlist may then be placed and routed to produce a data set describing geometric shapes to be applied to masks. The masks may then be used in various semiconductor fabrication steps to produce the common integrated circuit die. Alternatively, the database on the computer accessible storage medium may be the netlist (with or without the synthesis library) or the data set, as desired, or Graphic Data System (GDS) II data.

Although the present invention has been described with reference to preferred embodiments, workers skilled in the art will recognize that changes may be made in form and detail without departing from the scope of the invention.

What is claimed is:

1. A data processor implemented as an integrated circuit comprising:
    a processor die;
    an integrated voltage regulator die coupled to the processor die using die-to-die bonding, wherein the integrated voltage regulator die provides a regulated voltage to the processor die, and the processor die operates in response to the regulated voltage; and
    at least one additional integrated voltage regulator die, wherein each integrated voltage regulator die provides respective regulated voltages to separate portions of the processor die,
    wherein the integrated voltage regulator die and the at least one additional integrated voltage regulator die dynamically determine respective regulated voltages based on respective operating frequencies of the separate portions of the processor die, and the separate portions of the processor die comprise separate processor cores.

2. The data processor of claim 1, wherein the integrated voltage regulator die is coupled face-to-face to the processor die using hybrid bonding.

3. The data processor of claim 1, wherein the integrated voltage regulator die is coupled back-to-face to the processor die using hybrid bonding.

4. The data processor of claim 1, wherein the integrated circuit has an integrated voltage regulator die coupled to a specified portion of the processor die for providing a plurality of respective regulated voltages to corresponding portions of the processor die.

5. The data processor of claim 1, wherein the integrated voltage regulator die is a step-down converter.

6. The data processor of claim 1, wherein the integrated voltage regulator die comprises a switched mode power supply.

7. The data processor of claim 1, wherein the integrated voltage regulator die comprises a switched capacitor converter.

8. An integrated circuit comprising:
    a processor die comprising a plurality of processor cores;
    a first integrated voltage regulator die that is coupled to the processor die; and
    a second integrated voltage regulator die that is coupled to the processor die,
    wherein a first portion of the plurality of processor cores is coupled to the first integrated voltage regulator die, a second portion of the plurality of processor cores is coupled to the second integrated voltage regulator die, and the processor die and the first and second integrated voltage regulator dies are combined in a single integrated circuit package using hybrid bonding.

9. The integrated circuit of claim 8, wherein the first and second integrated voltage regulator dies and the processor die are coupled face-to-face using hybrid bonding.

10. The integrated circuit of claim 8, wherein the first integrated voltage regulator die and the processor die are coupled back-to-face using hybrid bonding, wherein the integrated circuit further comprises a redistribution layer coupled to a face surface of the first integrated voltage regulator die and to the processor die using through-dielectric vias.

11. The integrated circuit of claim 8, further wherein:
the first integrated voltage regulator die provides a respective regulated voltage to the first portion of the plurality of processor cores; and
the second integrated voltage regulator die provides a respective regulated voltage to the second portion of the plurality of processor cores.

12. The integrated circuit of claim 8, further comprising a plurality of through dielectric vias coupled to the processor die and isolated from the first integrated voltage regulator die for conducting signals to a corresponding plurality of bumps.

13. The integrated circuit of claim 8, further comprising gap fill dielectric between the first integrated voltage regulator die and the processor die.

14. The integrated circuit of claim 8, wherein the first integrated voltage regulator die comprises a Buck converter.

15. A data processor implemented as an integrated circuit, the data processor comprising:
a processor die including a first processor core area and a second processor core area;
a first integrated voltage regulator die coupled to the first processor core area using die-to-die bonding, wherein the first integrated voltage regulator die provides a first regulated voltage to the first processor core area, and the first processor core area operates in response to the first regulated voltage; and
a second integrated voltage regulator die coupled to the second processor core area using die-to-die bonding, wherein the second integrated voltage regulator die provides a second regulated voltage to the second processor core area, and the second processor core area operates in response to the second regulated voltage.

16. The data processor of claim 15, wherein:
the first processor core area comprises a first plurality of processor cores; and
the second processor core area comprises a second plurality of processor cores.

17. The data processor of claim 16, wherein:
each of the first plurality of processor cores operates at a respective voltage and frequency pair, and the first integrated voltage regulator die comprises a first plurality of integrated voltage regulators corresponding and coupled to respective ones of the first plurality of processor cores; and
each of the second plurality of processor cores operates at a respective voltage and frequency pair, and the second integrated voltage regulator die comprises a second plurality of integrated voltage regulators corresponding and coupled to respective ones of the second plurality of processor cores.

* * * * *